Inventor
ROGER CULLIS
By Percy P. Lantzy
Attorney

Inventor
ROGER CULLIS
By Percy P. Lantzy
Attorney 3,428,499

SEMICONDUCTOR PROCESS INCLUDING REDUCTION OF THE SUBSTRATE THICKNESS

Roger Cullis, London, England, assignor to International Standard Electric Corporation, New York, N.Y., a corporation of Delaware Filed Oct. 11, 1965, Ser. No. 494,350
Claims priority, application Great Britain, Jan. 1, 1965, 58/65
U.S. Cl. 148—174 8 Claims
Int. Cl. H01l 7/36, 7/50

ABSTRACT OF THE DISCLOSURE

A method of preparing a slice of semiconductor material having a region of high resistivity and a region of low resistivity, including the steps of forming in one major face of the high resistivity region of the slice, at least one hole with a layer of inert, optically distinctive material formed only on the sides and bottoms thereof, depositing a layer of low resistivity semiconductor material on said face and in said at least one hole and successively reducing the thickness of the slice from the face opposite said one face until the layer of optically distinct material on the bottoms of said holes is exposed. The thickness of the slice may be reduced by etching. A positional index of the interface between the grown layer and said one face may be provided at the periphery of the slice.

Figure 1A:
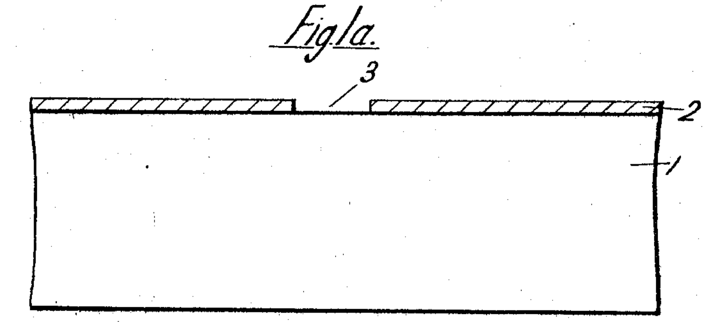
Figure 1B:
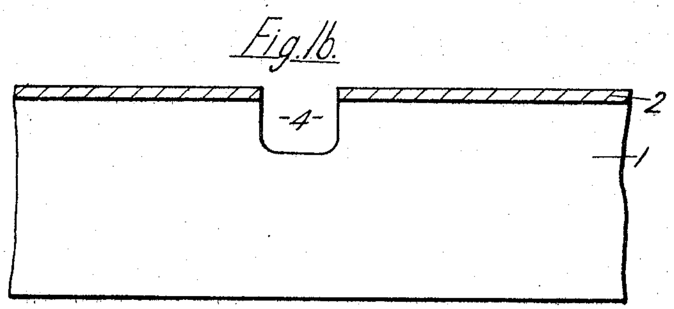

This invention relates to methods of preparation of semiconductor material.

The large numbers of impurity atoms which are present in semiconductor material of low resistivity give rise to imperfections such as point defects and dislocations which distort the crystalline lattice. If a high resistivity layer is grown epitaxially on a low resistivity substrate many of these imperfections propagate into it. These imperfections give rise to deleterious effects such as high leakage currents, "soft" breakdown characteristics and high noise levels, in devices which are subsequently fabricated in the high resistivity layer. On the other hand, a high degree of crystalline perfection is not usually required in the low resistivity region of such a slice of semiconductor material as, usually, its prime purpose is to serve as a mechanical support. It is therefore advantageous if a low resistivity layer can be grown on a high resistivity substrate, devices then being formed in the high resistivity region. However, for mechanical strength in the initial stages of the processing, the thickness of the high resistivity layer may require to be of the order of 125 microns thick, whilst for optimum electrical properties of the finished devices a thickness of about 12 microns may be desirable. As the thickness of the grown low resistivity layer may also be about 125 microns the problem which exists is to reduce the thickness of the high resistivity layer to 12 microns, with an accuracy of about 10 percent. Since the thickness of the epitaxially grown layer may also be known only to this accuracy, it is not possible to perform the thickness reduction purely by monitoring the total thickness of the slice.

It is an object of the present invention to provide an index for controlling the reduction in thickness of a slice of semiconductor material.

According to the present invention there is provided a method of preparing a slice of semiconductor material having a region of high resistivity and a region of low resistivity, including the steps of forming in one major face of the slice, holes with a layer of inert, optically distinctive material grown or deposited on the material constituting the sides and bottoms thereof, depositing a layer of semiconductor material on said face and in said holes, and successively reducing the thickness of the slice from the face opposite said one face until the layer of optically distinct material on the bottoms of said holes is exposed.

According to a particular aspect of the present invention there is provided a method of preparing a slice of semiconductor material including a region of high resistivity and a region of low resistivity wherein holes, the depth of which is approximately equal to the ultimate thickness of the high resistivity layer are formed in one face of a slice of high resistivity material a layer of an inert, optically distinct material is deposited or grown on at least the bottom surfaces of said holes, said one face of the slice of high resistivity material is suitably prepared and a layer of low resistivity semiconductor material is grown on it, and the thickness of the high resistivity layer is successively reduced from the face opposite said one face until the layer of optically distinct material on the bottoms of said holes is visible.

According to another particular aspect of the present invention there is provided a method of preparing a slice of semiconductor material including a region of high resistivity and a region of low resistivity in which holes of predetermined depth are formed in one face of a slice of high resistivity material, conductivity-type-determining impurity material is diffused into at least said one face, and the thickness of the slice is successively reduced from the face opposite said one face at least until the bottoms of said holes are visible.

Figure 1C:
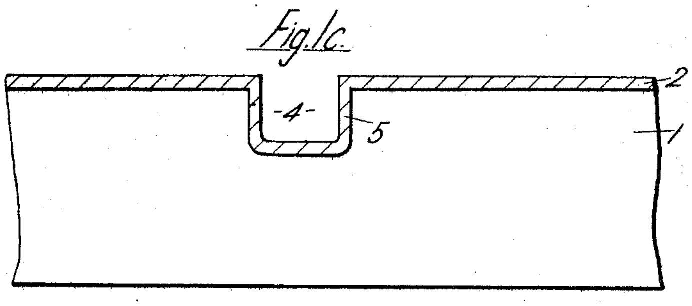
Figure 1D:
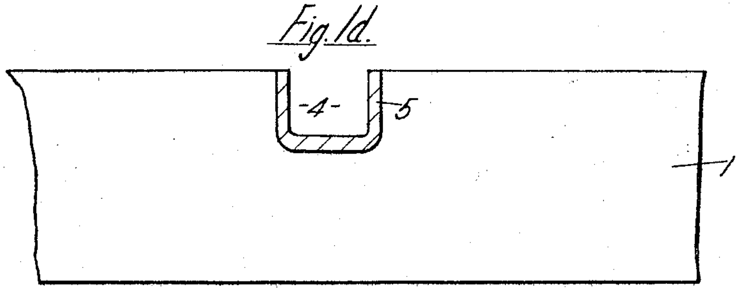
Figure 1E:
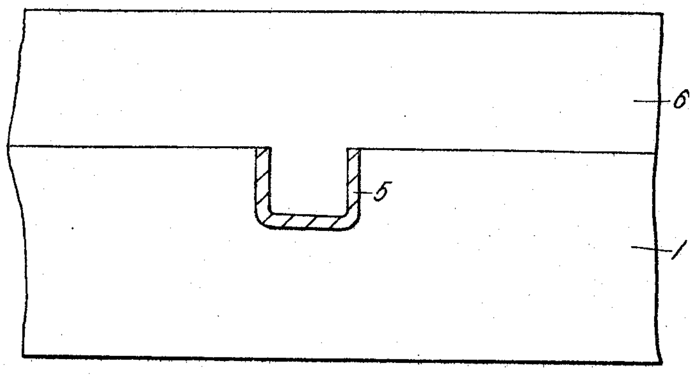
Figure 1F:
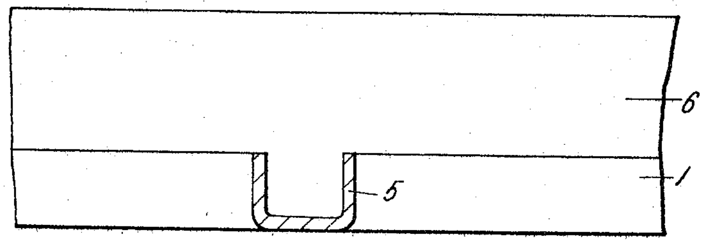
Figure 2:
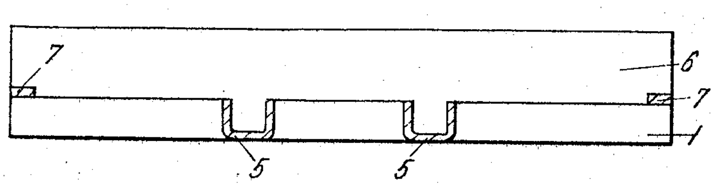

An embodiment of the invention will now be described with reference to the accompanying drawings in which:

FIG. 1 shows stages in preparation of a slice of silicon according to the invention, FIG. 2 shows a section of a slice of silicon having further indexing marks.

A slice of silicon of high resistivity preferably 3 to 6 ohm-cm., but at least greater than 0.4 ohm-cm., is oxidised and a number of windows about 100 microns in diameter are etched in the oxide on one face of the slice exposing the surface of the silicon, using photolithographic techniques. The slice, oxide and a window are shown at 1, 2 and 3 respectively in FIG. 1*a*. The slice is then heated to approximately 1200° C. in an atmosphere containing hydrogen chloride in hydrogen, and holes of about 15 microns depth etched in the exposed silicon surface. This is shown at 4 in FIG. 1*b*. The exposed silicon in the holes is then oxidised (5) (FIG. 1*c*). The oxide layer 2 is next removed from the slice leaving the subsequently grown layer 5 still in the etched holes. A layer of silicon of low resistivity preferably approximately 0.002 ohm-cm., but at least less than 0.2 ohm-cm., and thickness 125 microns is grown epitaxially on the surface of the slice 1, filling the holes 4 and covering the oxide layer 5.

The thickness of the high resistivity region 1 is then reduced to approximately 25 microns by lapping. This can be performed with sufficient accuracy by measuring the total thickness of the slice. Finally, the slice is subjected to a further hydrogen chloride etching process as described above to expose the oxide layer 5 as shown in FIG. 1*f*. The thickness of the high resistivity layer 1 is now substantially equal to the depth of the holes 4 originally etched, and the error in determination of the end-point of the etching process is determined by the thickness of the oxide layer which may typically be 0.4 micron.

Various departures may be made from the description of this embodiment without departing from the principles of the invention. For example, the layer 5 may be deposited by evaporation rather than thermally grown. It is not restricted to silicon dioxide, since the only properties required for the purposes of this invention are that it be electrically and chemically inert and optically distinctive.

Furthermore, the invention is not restricted to a single semiconductor. The epitaxially grown layer may be formed of a second material. In such a case it is not necessary that the first layer be of high resistivity and the grown layer of low resistivity. For example, it may be that although the first material requires a high temperature for epitaxial growth, the second material is unstable at such temperatures, or includes components having very high vapour pressures at these temperatures.

As another example, some chemical systems give rise to vapour transport of impurities during epitaxial growth. One instance is when a high resistivity silicon layer is grown by the silicon tetrachloride epitaxial process on a low resistivity substrate. Impurity atoms are carried up into the high resistivity layer by chloride ions, giving rise to a blurring of the interface. By use of the so-called inverse epitaxial techniques facilitated by the use of the present invention this undesirable effect can be minimised.

Another instance where the principles of the invention may be employed is where the low resistivity region is formed by diffusion of impurity into the high resistivity material. In this case it will not be necessary to provide the optically distinctive layer as the bottoms of the holes will provide the necessary index.

By an extension of the technique, a further indexing mark may be provided to show the interface between two layers. In this case optically distinctive material is left on the surface of the original slice of material in a ring round its periphery (shown at 7 in FIG. 2).

It is to be understood that the foregoing description of specific examples of this invention is made by way of example only and is not to be considered as a limitation on its scope.

What I claim is:

1. A method of preparing a slice of semiconductor material having a region of high resistivity and a region of low resistivity, including the steps of forming in one major face of the high resistivity region of the slice, at least one hole with a layer of inert, optically distinctive material formed only on the sides and bottoms thereof, depositing a layer of low resistivity semiconductor material on said face and in said at least one hole, and successively reducing the thickness of the slice from the face opposite said one face until the layer of optically distinct material on the bottoms of said holes is exposed.

2. A method as claimed in claim 1 wherein at least the final stage of the step of reducing the thickness of the slice is performed by etching.

3. A method as claimed in claim 1 wherein said inert, optically distinct material consists substantially of an oxide of silicon.

4. A method as claimed in claim 1 wherein the semiconductor material is silicon.

5. A method as claimed in claim 1 where a positional index of the interface between the grown layer and said one face is provided at the periphery of the slice.

6. A process according to claim 1 wherein said distinctive material is electrically non-conducting and nonreactive with said semiconductor material.

7. A method of preparing a slice of semiconductor material including a region of high resistivity and a region of low resistivity wherein holes, the depth of which is approximately equal to the ultimate thickness of the high resistivity layer, are formed in one face of a slice of high resistivity material, a layer of an inert, optically distinct material is formed only on the bottom surfaces of said holes, said one face of the slice of high resistivity material is suitably prepared for growing semiconductor material thereon and a layer of low resistivity semiconductor material is grown on it, and the thickness of the high resistivity layer is successively reduced from the face opposite said one face until the layer of optically distinct material on the bottoms of said holes is exposed.

8. A method as claimed in claim 7 wherein a first semiconductor material is substituted for the high resistivity material and a second semiconductor material is substituted for the low resistivity material.

References Cited

UNITED STATES PATENTS

| | | | |
|---|---|---|---|
| 3,142,596 | 7/1964 | Theverer | 148—175 |
| 3,261,727 | 7/1966 | Dehmelt et al. | 148—175 |
| 3,308,354 | 3/1967 | Tucker | 148—175 XR |
| 3,312,879 | 4/1967 | Godejahn | 148—175 XR |
| 3,320,485 | 5/1967 | Buie | 29—578 XR |

OTHER REFERENCES

Electronics Review, vol. 37, No. 17, June 1, 1964, p. 23.

HYLAND BIZOT, *Primary Examiner.*

PAUL WEINSTEIN, *Assistant Examiner.*

U.S. Cl. X.R.

29—574, 578, 580; 117—106, 201; 148—175; 156—17